(12) United States Patent
Ryu

(10) Patent No.: US 9,386,199 B2
(45) Date of Patent: Jul. 5, 2016

(54) CAMERA MODULE

(75) Inventor: Youngjun Ryu, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 217 days.

(21) Appl. No.: 13/885,952

(22) PCT Filed: Nov. 9, 2011

(86) PCT No.: PCT/KR2011/008509
§ 371 (c)(1),
(2), (4) Date: May 16, 2013

(87) PCT Pub. No.: WO2012/067373
PCT Pub. Date: May 24, 2012

(65) Prior Publication Data
US 2013/0235263 A1    Sep. 12, 2013

(30) Foreign Application Priority Data
Nov. 16, 2010  (KR) .................. 10-2010-0113828

(51) Int. Cl.
H04N 5/225 (2006.01)
H01L 27/146 (2006.01)

(52) U.S. Cl.
CPC ........ *H04N 5/2253* (2013.01); *H01L 27/14618* (2013.01); *H04N 5/2254* (2013.01); *H04N 5/2257* (2013.01); *H01L 2924/0002* (2013.01)

(58) Field of Classification Search
CPC combination set(s) only.
See application file for complete search history.

(56) References Cited

U.S. PATENT DOCUMENTS

| 7,262,405 B2 * | 8/2007 | Farnworth et al. ........... 250/239 |
| 2004/0239794 A1 * | 12/2004 | Saito et al. ................. 348/340 |
| 2006/0208182 A1 | 9/2006 | Tsukamoto et al. |
| 2007/0145569 A1 * | 6/2007 | Hsin ........................... 257/700 |
| 2008/0237768 A1 * | 10/2008 | Yajima et al. ................. 257/434 |
| 2013/0235263 A1 * | 9/2013 | Ryu ............................ 348/374 |

FOREIGN PATENT DOCUMENTS

| JP | 2004-153855 A | 5/2004 |
| JP | 2006-245246 A | 9/2006 |
| KR | 10-2008-0085444 A | 9/2008 |
| KR | 10-2009-0036754 A | 4/2009 |

OTHER PUBLICATIONS

International Search Report in International Application No. PCT/KR2011/008509, filed Nov. 9, 2011.

* cited by examiner

*Primary Examiner* — Roberto Velez
*Assistant Examiner* — Tuan Le
(74) *Attorney, Agent, or Firm* — Saliwanchik, Lloyd & Eisenschenk

(57) ABSTRACT

Disclosed is a camera module, the module including an IR filter for filtering infrared rays, an image sensor located under the IR filter to convert an incident optic image into an electric signal, a first PCB having a window to permit passage of the optic image and a cavity extending downwards from the window to accommodate the image sensor, a predetermined portion of an upper portion of the cavity being electrically connected to a predetermined portion of an upper surface of the image sensor, and a first through hole taking a shape of a pipe that is connected at one end thereof to the window and connected at the other end to the cavity, the first through hole serving as a path for discharging air between the IR filter and the image sensor.

9 Claims, 2 Drawing Sheets

CAMERA MODULE

CROSS-REFERENCE TO RELATED APPLICATIONS

This application is the U.S. national stage application of International Patent Application No. PCT/KR2011/008509, filed Nov. 9, 2011, which claims priority to Korean Application No. 10-2010-0113828, filed Nov. 16, 2010, the disclosures of each of which are incorporated herein by reference in their entirety.

TECHNICAL FIELD

The present invention relates to a camera module.

BACKGROUND ART

Recently, there is an increasing demand for a small-sized camera module used for an image input device for an information terminal such as a surveillance camera or a video tape recorder, as well as a variety of multimedia fields including a notebook-sized personal computer, a camera phone, a personal digital assistant (PDA), a smart-phone, and a toy.

As a pixel size of a sensor applied to the camera module becomes smaller and smaller and a height of the module is reduced, there is an urgent demand for development of a mounting structure for preventing inflow of foreign substances and achieving mechanical reliability of the camera module against a tilt or shift of an optic axis of a lens.

FIG. 1 is a view illustrating an image sensor and an IR (Infrared) filter attached to a printed circuit board (PCB) according to the prior art.

As shown in FIG. 1, according to the prior art, the image sensor 2 is bonded to the PCB 1 and thereafter the IR filter 3 coupled with a cover glass 4 is attached to a top of the PCB 1 so as to prevent contamination due to foreign substances and block infrared rays.

In this case, a space between the image sensor 2 and the IR filter 3 is sealed. However, air present in the sealed space expands while an adhesive (Epoxy/Glue/Bond) is thermally strengthened, thus causing an opened sealing or a tilt between the IR filter 3 and the cover glass 4.

Further, a reduction in adhesive strength between the IR filter 3 and the cover glass 4 may deteriorate mechanical reliability of the camera module, and may cause inflow of foreign substances between the image sensor 2 and the IR filter 3 because of the opened sealing.

DISCLOSURE OF INVENTION

Technical Problem

The present invention provides a camera module, configured to discharge expanded air from a space between an image sensor and an IR filter, thus improving mechanical reliability.

Solution to Problem

In an aspect of the present invention, there is provided a camera module, the module comprising: an IR filter for filtering infrared rays; an image sensor located under the IR filter to convert an incident optic image into an electric signal; a first PCB including a window to permit passage of the optic image and a cavity extending downwards from the window to accommodate the image sensor, a predetermined portion of an upper portion of the cavity being electrically connected to a predetermined portion of an upper surface of the image sensor; and a first through hole taking a shape of a pipe that is connected at one end thereof to the window and connected at the other end to the cavity, the first through hole serving as a path for discharging air between the IR filter and the image sensor.

In another aspect of the present invention, there is provided a camera module, the module comprising: an IR filter for filtering infrared rays; an image sensor located under the IR filter to convert an incident optic image into an electric signal; a first PCB including a window to permit passage of the optic image, and a cavity extending downwards from the window to accommodate the image sensor; a second PCB located under the first PCB such that a lower surface of the image sensor is attached to an upper surface of the second PCB; and a second through hole taking a shape of a pipe that is connected at one end thereof to the cavity and connected at the other end to an outside of the second PCB, the second through hole serving as a path for discharging air between the IR filter and the image sensor.

Further, the present invention provides a camera module, comprising: at least one lens for receiving an optic image of a subject; a first PCB having a window to permit the optic image to pass through the lens; an IR filter attached to the first PCB; and an image sensor electrically bonded to the first PCB to convert the optic image passing through the window of the first PCB into an electric signal, wherein the window is located between the IR filter and the image sensor, and a through hole is formed through the first PCB to discharge air out from the window.

The first PCB may have a cavity extending downwards from the window to accommodate the image sensor.

Further, one end of the through hole may communicate with the window, while the other end may communicate with the cavity.

The camera module may further include a second PCB electrically connected to the first PCB and another device.

Further, a cover glass may be attached to the IR filter, and the cover glass attached to the IR filter may be attached to the PCB.

Further, the present invention provides a camera module, comprising: at least one lens for receiving an optic image of a subject; a first PCB having a window to permit the optic image to pass through the lens; an IR filter attached to the first PCB; an image sensor for converting the optic image passing through the window of the first PCB into an electric signal; and a second PCB having the image sensor mounted thereon, wherein a through hole is formed through the second PCB to discharge air present between the IR filter and the image sensor.

The first PCB may have a cavity extending downwards from the window to accommodate the image sensor.

The first PCB may be bonded to the second PCB.

Further, one end of the through hole may communicate with the cavity, and the other end may communicate with an outside of the second PCB.

The second PCB may comprise a flexible printed circuit board (FPCB).

Further, a connector connected with another device may be attached to the second PCB.

Further, a cover glass may be attached to the IR filter, and the cover glass attached to the IR filter may be attached to the PCB.

Advantageous Effects of Invention

A camera module according to an embodiment of the present invention is advantageous in that expanded air between an IR filter and an image sensor is discharged through a through hole, thus providing stable adhesive strength for the IR filter, and preventing a tilt of a cover glass attached to the IR filter.

Further, the camera module provides the stable adhesive strength for the IR filter and prevents the cover glass from being tilted, thus increasing mechanical reliability of the camera module.

MODE FOR THE INVENTION

Figure 1:
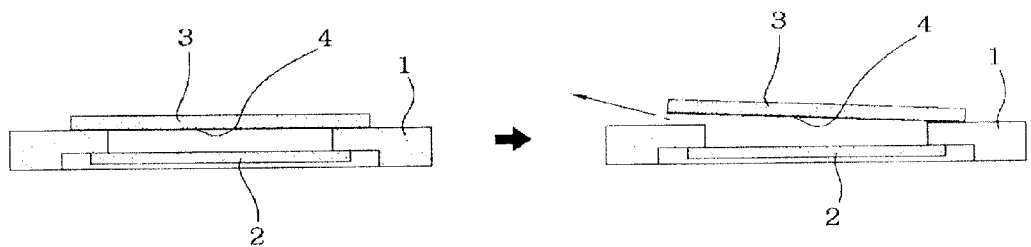
FIG. 1 is a view illustrating an image sensor and an IR filter attached to a printed circuit board (PCB) according to the prior art.

Since the present invention may be variously changed and include several embodiments, particular embodiments shown in the drawings will be described in detail in the detailed description. However, it is to be understood that the invention is not limited to the particular embodiments, and various changes, equivalences and substitutions may be made without departing from the scope and spirit of the invention.

Although the terms "first", "Second", etc. are used herein to describe various components, these components should not be limited by these terms. These terms are only used to distinguish one component from another component.

For example, the second component may be designated as the first component without departing from the scope of the invention. Similarly, the first component may be designated as the second component.

Further, when the term "couple" or "connect" is used in the specification or claims, it is intended to mean not only "directly coupled or connected to" but also "indirectly coupled or connected to" such as connected through another component or components. In contrast, the term "directly coupled or connected to" means that there is no component between the coupled or connected components.

Also it is to be understood that terms employed herein are for the purpose of description of particular embodiments and not of limitation. Further, the singular forms "a" and "an" include plural referents unless the context clearly dictates otherwise. Furthermore, it should be understood that terms "include" or "have" are inclusive of characteristics, numerals, steps, operations, components, parts or combination thereof, which are described herein, but are not exclusive of one or more different characteristics, numerals, steps, operations, components, parts or combination thereof.

Now, a camera module according to an embodiment of the present invention will be described in detail with reference to the accompanying drawings, in which the same reference numerals are used throughout the different drawings to designate the same or similar components and a duplicated description thereof will be omitted.

Figure 2:
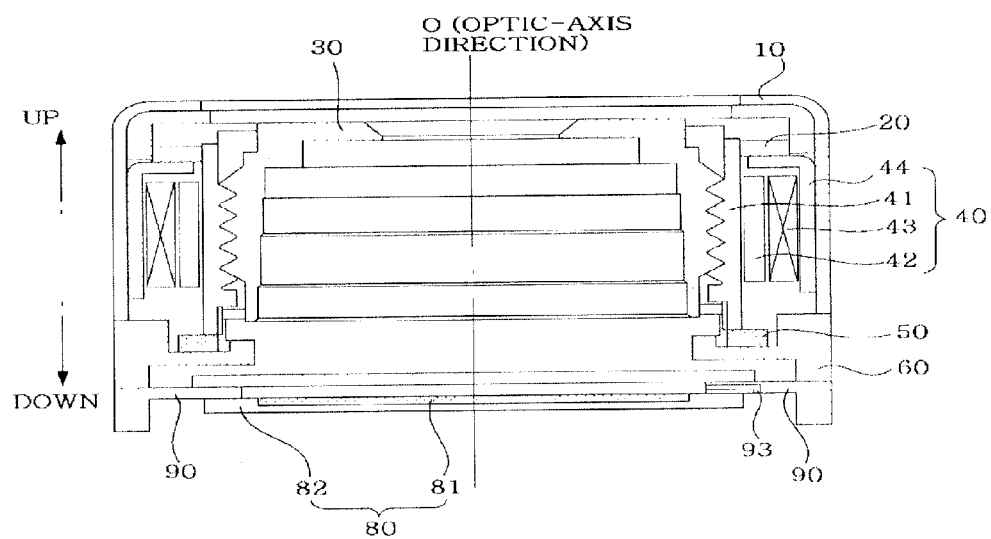
FIG. 2 is a sectional view illustrating a camera module in accordance with a first embodiment of the present invention.
Figure 3:
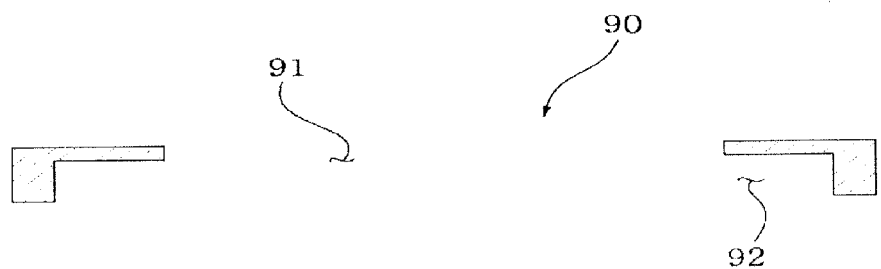
FIG. 3 is a sectional view illustrating a first PCB of FIG. 2.

FIG. 2 is a sectional view illustrating a camera module in accordance with a first embodiment of the present invention, and FIG. 3 is a sectional view illustrating a first PCB of FIG. 2.

As shown in FIG. 2, the camera module of the present invention includes a casing 10, an upper elastic member 20, a lens barrel 30, an actuator 40, a lower elastic member 50, a frame 60, an IR filter 70, an image sensor 80, and a first PCB 90.

In the drawing of this invention, the camera module having the actuator 40 is shown. The actuator 40 serves as a moving part for moving the lens barrel 30 in a direction of an optic axis O for the purpose of auto focusing. However, the present invention may be applied to a camera module having no actuator. In the case of the camera module having no actuator, the lens barrel 30 instead of a bobbin 41 is fastened to a holder in a threaded manner. In the present invention, the bobbin 41 serves as the holder for holding the lens barrel 30.

The casing 10 takes a shape of a box that is open at a bottom thereof, with a light transmission hole being formed through a central portion of a top thereof. The bottom of the casing 10 is supported by the frame 60.

The casing 10 combines with the frame 60 to create a space. The upper elastic member 20, the lens barrel 30, and the actuator 40 are accommodated in the space.

The casing 10 is preferably manufactured of plastics to insulate an inside from an outside thereof. For mass production, the casing 10 may be formed by injection molding.

The upper elastic member 20 is a plate spring inserted into an upper portion of the casing 10. An outer portion of the upper elastic member 20 is supported by a yoke 44 of the actuator 40, while an inner portion of the upper elastic member 20 makes contact with the bobbin 41 of the actuator 40 to pressurize an upper portion of the bobbin 41.

The lower elastic member 50 is a plate spring and is placed under the actuator 40 to pressurize a lower portion of the bobbin 41.

The lower elastic member 50 may be formed with the bobbin 41 by insert injection molding. Alternatively, the lower elastic member 50 may be bonded to the bobbin 41 using an adhesive.

The lens barrel 30 functions to hold and protect a plurality of lenses. The lenses for receiving an optic image of a subject are sequentially layered in the lens barrel 30 along the optic axis O.

A thread is formed on an outer circumference of the lens barrel 30 to mesh with a thread formed on an inner circumference of the bobbin 41.

The bobbin 41 takes a shape of a cylinder that is open at a top and a bottom thereof, and has on the inner circumference thereof the thread to correspond to the thread 31 of the lens barrel 30. According to the present invention, the lens barrel 30 is fastened to the inner circumference of the bobbin 41 in a threaded manner, thus enabling far focusing of the camera module.

A coil 42 is wound around the bobbin 41 in a direction perpendicular to magnetic flux to interact with a permanent magnet 43.

The yoke 44 is inserted into the casing 10 to prevent a magnetic field between the coil 42 and the permanent magnet 43 from being discharged to an outside. The permanent magnet 43 is installed inside the yoke 44 to be provided on opposite sides of the bobbin 41. The yoke 44 is supported by the frame 60.

When voltage is applied to the coil 42, a current flowing in the coil 42 interacts with a magnetic field of the permanent magnet 43 according to the Fleming s left hand rule, so that the bobbin 41 is forced upwards along the optic axis. Here, the greater an intensity of current applied to the coil 42 is, the longer a distance by which the lens barrel 30 and the bobbin 41 move upwards along the optic axis is.

Subsequently, when the voltage applied to the coil 42 is cut off, the lens barrel 30 and the bobbin 41 are moved downwards along the optic axis by elastic force of the upper and lower elastic members 20 and 50, thus returning to their original positions.

The frame 60 takes a rectangular shape with a central opening to allow the optic image to pass through the image sensor 80. The frame 60 is located under the lens barrel 30.

As shown in FIG. 3, the first PCB 90 is placed under the lens barrel 30, and includes a window 91 to allow passage of the optic image. A cavity 92 is formed under the window 91 to receive the image sensor 80.

An inner surface of an upper portion of the cavity 92 is electrically connected to an upper surface of the image sensor 80. A height of the cavity 92 is greater than a thickness of the image sensor 80.

The window 91 is formed over the cavity 92 in such a way as to extend from the inner surface of the upper portion of the cavity 92 to an upper surface of the first PCB 90, and allows the optic image to pass through the image sensor 80. Here, an area of the window 91 is smaller than an area of the upper surface of the image sensor 80.

The IR filter 70 is attached to the upper surface of the window 91 of the first PCB 90 to filter infrared rays. An area of the IR filter 70 is larger than the area of the window 91.

A cover glass is attached to a bottom of the IR filter 70. For the convenience of description, FIG. 2 shows the IR filter 70 integrated with the cover glass.

The image sensor 80 includes an image capturing region 81 and a non-capturing region 82 to convert an optic image into an electric signal. The image capturing region 81 is composed of a plurality of pixels to detect the optic image (image data) passing through a plurality of lenses. The non-capturing region 82 has no pixels.

According to the first embodiment of the present invention, a first through hole 93 is formed through the first PCB 90 to make the window 91 communicate with the cavity 92.

The first through hole 93 takes a shape of a pipe that is open at opposite ends thereof. One end is connected to the window 91 and the other end is connected to the cavity 92, thus forming a path for discharging air between the IR filter 70 and the image sensor 80.

That is, according to the first embodiment of the present invention, expanded air present between the IR filter 70 and the image sensor 80 is discharged through the first through hole 93, thus providing stable adhesive strength for the IR filter 70 and preventing the cover glass attached to the IR filter 70 from being tilted.

Further, the stable adhesive strength for the IR filter 70 and the tilt prevention of the cover glass can increase mechanical reliability of the camera module.

The first embodiment of the present invention may be implemented as a camera module including at least one lens for receiving an optic image of a subject, a first PCB having a window to permit the optic image to pass through the lens, an IR filter attached to the first PCB, and an image sensor electrically bonded to the first PCB to convert the optic image passing through the window of the first PCB into an electric signal, wherein the window is located between the IR filter and the image sensor, and a through hole is formed through the first PCB to discharge air out from the window.

The first PCB may have a cavity extending downwards from the window to accommodate the image sensor.

Further, one end of the through hole communicates with the window, while the other end communicates with the cavity.

The camera module may further include a second PCB electrically connected to the first PCB and another device.

Further, a cover glass may be attached to the IR filter, and the cover glass attached to the IR filter may be attached to the PCB.

Figure 4:
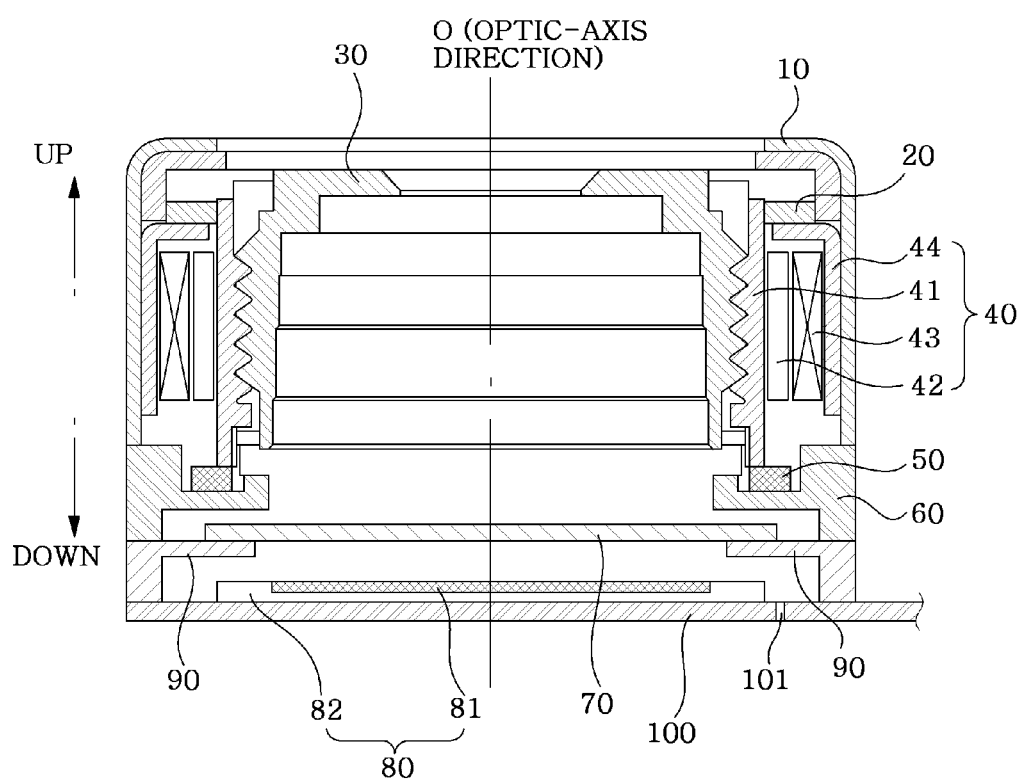
FIG. 4 is a sectional view illustrating a camera module in accordance with a second embodiment of the present invention.

FIG. 4 is a sectional view illustrating a camera module in accordance with a second embodiment of the present invention.

A general construction of the camera module of FIG. 4 remains the same as the camera module of FIG. 2 except that a lower surface of an image sensor 80 is attached to an upper surface of a second PCB 100 and a second through hole 101 is formed through the second PCB 100. Thus, the construction and effect of the camera module shown in FIG. 2 will be omitted below for the convenience of description.

As shown in FIG. 4, the second PCB 100 is a flexible printed circuit board (FPCB) that is positioned under a first PCB 90 and extends to an outside of the first PCB 90. A connector (not shown) connected to other devices may be attached to the upper surface of the second PCB 100 extending to the outside of the first PCB 90.

In the second embodiment of the present invention, the second through hole 101 is formed through the second PCB 100 to make a cavity 92 communicate with an outside of the camera module.

The second through hole 101 takes a shape of a pipe that is open at opposite ends thereof. One end is connected to the cavity 92 and the other end is connected to the outside of the camera module, thus forming a path for discharging air between the IR filter 70 and the image sensor 80.

That is, according to the second embodiment of the present invention, expanded air present between the IR filter 70 and the image sensor 80 is discharged through the second through hole 101, thus providing stable adhesive strength for the IR filter 70, and preventing the cover glass attached to the IR filter 70 from being tilted.

As such, the stable adhesive strength for the IR filter 70 and the tilt prevention of the cover glass can increase mechanical reliability of the camera module.

Further, the second embodiment of the present invention may be implemented as a camera module including at least one lens for receiving an optic image of a subject, a first PCB having a window to permit the optic image to pass through the lens, an IR filter attached to the first PCB, an image sensor for converting the optic image passing through the window of the first PCB into an electric signal, and a second PCB having the image sensor mounted thereon, wherein a through hole is formed through the second PCB to discharge air present between the IR filter and the image sensor.

The first PCB may have a cavity extending downwards from the window to accommodate the image sensor.

Further, the first PCB may be bonded to the second PCB.

Further, one end of the through hole may communicate with the cavity, and the other end may communicate with an outside of the second PCB.

Moreover, the second PCB may comprise a flexible printed circuit board (FPCB).

Further, a connector connected with another device may be attached to the second PCB.

Furthermore, a cover glass may be attached to the IR filter, and the cover glass attached to the IR filter may be attached to the PCB.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

The present invention provides a camera module, which provides stable adhesive strength for an IR filter and prevents a cover glass from being tilted, thus improving mechanical reliability.

The invention claimed is:

1. A camera module, comprising:
    an IR filter for filtering infrared rays;
    an image sensor located under the IR filter to convert an incident optic image into an electric signal; and
    a first PCB including a window to permit passage of the optic image and a cavity extending downwards from the window to accommodate the image sensor, a predetermined portion of an upper portion of the cavity being electrically connected to a predetermined portion of an upper surface of the image sensor;
    wherein the window is located between the IR filter and the image sensor, and a first through hole is formed through the first PCB and takes a shape of an angled pipe that is connected at one end to the window and connected at the other end to the cavity to discharge air out from the window.

2. The camera module as set forth in claim 1, wherein the IR filter is attached to an upper surface of the window of the first PCB, and an area of the IR filter is greater than an area of the window.

3. The camera module as set forth in claim 1, wherein an area of the window is less than an area of the upper surface of the image sensor.

4. The camera module as set forth in claim 1, wherein the first through hole is formed through the first PCB.

5. A camera module, comprising:
    at least one lens for receiving an optic image of a subject;
    a first PCB having a window to permit the optic image to pass through the lens;
    an IR filter attached to the first PCB; and
    an image sensor electrically bonded to the first PCB to convert the optic image passing through the window of the first PCB into an electric signal,
    wherein the window is located between the IR filter and the image sensor, and a through hole is formed through the first PCB to discharge air out from the window.

6. The camera module as set forth in claim 5, wherein the first PCB has a cavity extending downwards from the window to accommodate the image sensor.

7. The camera module as set forth in claim 6, wherein one end of the through hole communicates with the window, while the other end communicates with the cavity.

8. The camera module as set forth in claim 7, further comprising:
    a second PCB electrically connected to the first PCB and another device.

9. The camera module as set forth in claim 5, wherein a cover glass is attached to the IR filter, and the cover glass attached to the IR filter is attached to the PCB.

* * * * *